(12) United States Patent
Söderkvist et al.

(10) Patent No.: US 12,057,789 B2
(45) Date of Patent: Aug. 6, 2024

(54) ELECTROMECHANICAL ACTUATORS WITH COMPOSITE DRIVE PADS

(71) Applicant: Acuvi AB, Uppsala (SE)

(72) Inventors: Jan Söderkvist, Täby (SE); Andreas Danell, Vattholma (SE)

(73) Assignee: Acuvi AB, Uppsala (SE)

( * ) Notice: Subject to any disclaimer, the term of this patent is extended or adjusted under 35 U.S.C. 154(b) by 224 days.

(21) Appl. No.: 17/782,008

(22) PCT Filed: Dec. 15, 2020

(86) PCT No.: PCT/SE2020/051213
§ 371 (c)(1),
(2) Date: Jun. 2, 2022

(87) PCT Pub. No.: WO2021/126056
PCT Pub. Date: Jun. 24, 2021

(65) Prior Publication Data
US 2023/0009043 A1    Jan. 12, 2023

(30) Foreign Application Priority Data
Dec. 16, 2019 (SE) .................... 1951464-5

(51) Int. Cl.
*H02N 2/00* (2006.01)
(52) U.S. Cl.
CPC ............. *H02N 2/007* (2013.01); *H02N 2/22* (2013.01)
(58) Field of Classification Search
CPC ........ H02N 2/007; H02N 2/22; H02N 2/0015; H02N 2/0065; H02N 2/103; H02N 2/026; H10N 30/03
See application file for complete search history.

(56) References Cited

U.S. PATENT DOCUMENTS

| 4,453,103 A | 6/1984 | Vishnevsky et al. |
| 5,233,257 A | 8/1993 | Luthier et al. |
| (Continued) | | |

FOREIGN PATENT DOCUMENTS

| DE | 102010061255 | 6/2012 |
| WO | 2009000256 | 12/2008 |
| (Continued) | | |

OTHER PUBLICATIONS

International Search Report issued in PCT/SE2020/051213 dated Jan. 25, 2021.
(Continued)

*Primary Examiner* — Emily P Pham
(74) *Attorney, Agent, or Firm* — Fox Rothschild LLP; Carol E. Thorstad-Forsyth

(57) ABSTRACT

A manufacturing method for an electromechanical drive element comprises providing (S10) of an excitation body comprising at least one volume of electromechanical material. The excitation body has a metal plate integrated as a surface of the excitation body. The excitation body being arranged to cause shape changes of the electromechanical material and the metal plate when the volume(s) of electromechanical material being excited by a voltage signal. A composite drive pad is provided (S20). The composite drive pad comprises a metal portion directly joined to a ceramic portion. After the providing of a composite drive pad, the metal portion of the composite drive pad is irreversibly attached (S30) to the metal plate of the excitation body by use of a metal-based bond. An electromechanical drive element and an electromechanical motor using such an electromechanical drive element are also disclosed.

20 Claims, 7 Drawing Sheets

(56) References Cited

U.S. PATENT DOCUMENTS

| | | | |
|---|---|---|---|
| 8,482,185 B2* | 7/2013 | Wischnewskij | H02N 2/026 |
| | | | 310/323.01 |
| 2003/0052573 A1 | 3/2003 | Wischnewskiy | |
| 2004/0251782 A1 | 12/2004 | Johansson et al. | |
| 2011/0050035 A1 | 3/2011 | Wischnewskiy et al. | |
| 2017/0359002 A1 | 12/2017 | Morita et al. | |
| 2019/0296660 A1 | 9/2019 | Wischnewskiy et al. | |

FOREIGN PATENT DOCUMENTS

| | | |
|---|---|---|
| WO | 2019035757 A1 | 2/2019 |
| WO | 2019045630 A1 | 3/2019 |

OTHER PUBLICATIONS

Dourandish and Simchi, "Study the sintering behavior of nanocrystalline 3Y-TZP/430L stainless-steel composite layers for co-powder injection molding," J. Mater. Sci., 44, pp. 1264-1274 (2009).

Extended European Search Report for European Patent Application No. 20 901 483 dated Mar. 26, 2024 (11 pages).

Simchi and Pfetzoldt, "Cosintering of Powder Injection Molding Parts Made from Ultrafine WC-Co and 316L Stainless Steel Powders for Fabrication of Novel Composite Structures," The Minerals, Metals & Materials Society and ASM International 2009, Metallurgical and Materials Transactions A, vol. 41A, pp. 233-241 (2010).

\* cited by examiner

ELECTROMECHANICAL ACTUATORS WITH COMPOSITE DRIVE PADS

RELATED APPLICATION DATA

The present application is a National Phase of International Patent Application No. PCT/SE2020/051213, which was filed on Dec. 15, 2020, entitled "ELECTROMECHANICAL ACTUATORS WITH COMPOSITE DRIVE PADS" and claims priority to Sweden Patent Application No. 951464-5 which was filed on Dec. 16, 2019. The contents of these applications are incorporated herein by reference in its entirety.

TECHNICAL FIELD

The present technology refers in general to electromechanical actuators, and in particular to driving parts of electromechanical actuators and manufacturing thereof.

BACKGROUND

Electromechanical actuators are today used in many technical fields. The actuating is based on an interaction between an electromechanical drive element and a body to be driven. Electromechanical material in the electromechanical drive element is excited by an electrical signal, which exciting results in a shape change of the electromechanical drive element. The shape change causes a motion of a drive pad, which acts, typically by pulling or pushing, on the body to be driven. By repeating changes of the electrical signal, a displacement of the body to be driven relative the electromechanical drive element can be achieved.

The drive pad is thus often used in linear or rotating electromechanical motors, such as e.g. piezoelectric motors, as the component that pulls and/or pushes the body to be driven, often also referred to as a drive rod, translator or rotor. This means that the drive pad is the link between the active part of the motor, i.e. the electromechanical drive element, often also referred to as a stator, and the body to be driven. The drive pad needs to be attached in a fixed way to the active parts of the motor in order to deliver a strong force to the body to be driven.

The electromechanical drive element typically comprises ceramic material, possibly with integrated electrodes, as well as metal parts intended for achieving particular bending or vibration properties. Such an assembly may be sensitive to high temperatures, for instance if cold rolled steel materials are used for springs. The drive pads are typically also ceramic parts, for having a high resistance against wear in the contact to the body to be moved.

A typical approach today for fastening the drive pad to the electromechanical drive element is to use different kinds of glue. However, gluing the drive pad to its base surface at the electromechanical drive element is not an ideal solution. It is often difficult to perform the fastening procedures in a reproducible manner. Gluing typically involves an uncertainty as to thickness of the glue layer and its variation over the attachment surface. The glue material properties may also vary and is known to be age dependent. Glue typically has a lower Young's modulus compared both to ceramics and sheet metal. Furthermore, glue can also introduce undesired temperature characteristics, in particular at high temperature when glue softens. This may introduce changes of the elastic properties. Glue is also prone to the formation of micro cracks at the edges, in particular in the presence of high thermal or mechanical stresses.

SUMMARY

A general object is to provide electromechanical drive elements with reliable and reproducible drive pads.

The above object is achieved by methods and devices according to the independent claims. Preferred embodiments are defined in dependent claims.

In general words, in a first aspect, a manufacturing method for an electromechanical drive element comprises providing of an excitation body comprising at least one volume of electromechanical material. The excitation body has a metal plate integrated as a surface of the excitation body. The excitation body being arranged to cause shape changes of the electromechanical material and the metal plate when the volume(s) of electromechanical material being excited by a voltage signal. A composite drive pad is provided. The composite drive pad comprises a metal portion directly joined to a ceramic portion. After the providing of a composite drive pad, the metal portion of the composite drive pad is irreversibly attached to the metal plate of the excitation body by use of a metal-based bond.

In a second aspect, an electromechanical drive element comprises an excitation body, in turn comprising at least one volume of electromechanical material and a composite drive pad. The composite drive pad is a mechanical-contact part of the electromechanical drive element intended for providing a driving action thereof. The excitation body has a metal plate integrated as a surface of the excitation body. The excitation body is arranged to cause shape changes of the electromechanical material and the metal plate when the volume(s) of electromechanical material being excited by a voltage signal. The composite drive pad has a ceramic portion and a metal portion. The metal portion is directly joined onto the ceramic portion. The metal portion of the composite drive pad is irreversibly attached to the metal plate of the excitation body by means of a metal-based bond.

In a third aspect, an electromechanical motor comprises an electromechanical drive element according to the second aspect. The electromechanical motor further comprises a body to be driven, mounted to be in contact with the ceramic portion of the composite drive pad. The electromechanical motor further comprises means for providing a normal force between the electromechanical drive element and the body to be driven. The electromechanical motor further comprises a power supply connected to the excitation body for exciting the volume(s) of electromechanical material. The electromechanical motor further comprises a control unit configured to control an operation of the power supply.

One advantage with the proposed technology is that electromechanical drive elements are able to be provided with a good and controlled joint between the drive pad and the excitation body, and that this is achievable in a cost-efficient manner.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the drawings, the same reference numbers are used for similar or corresponding elements.

Figure 1:
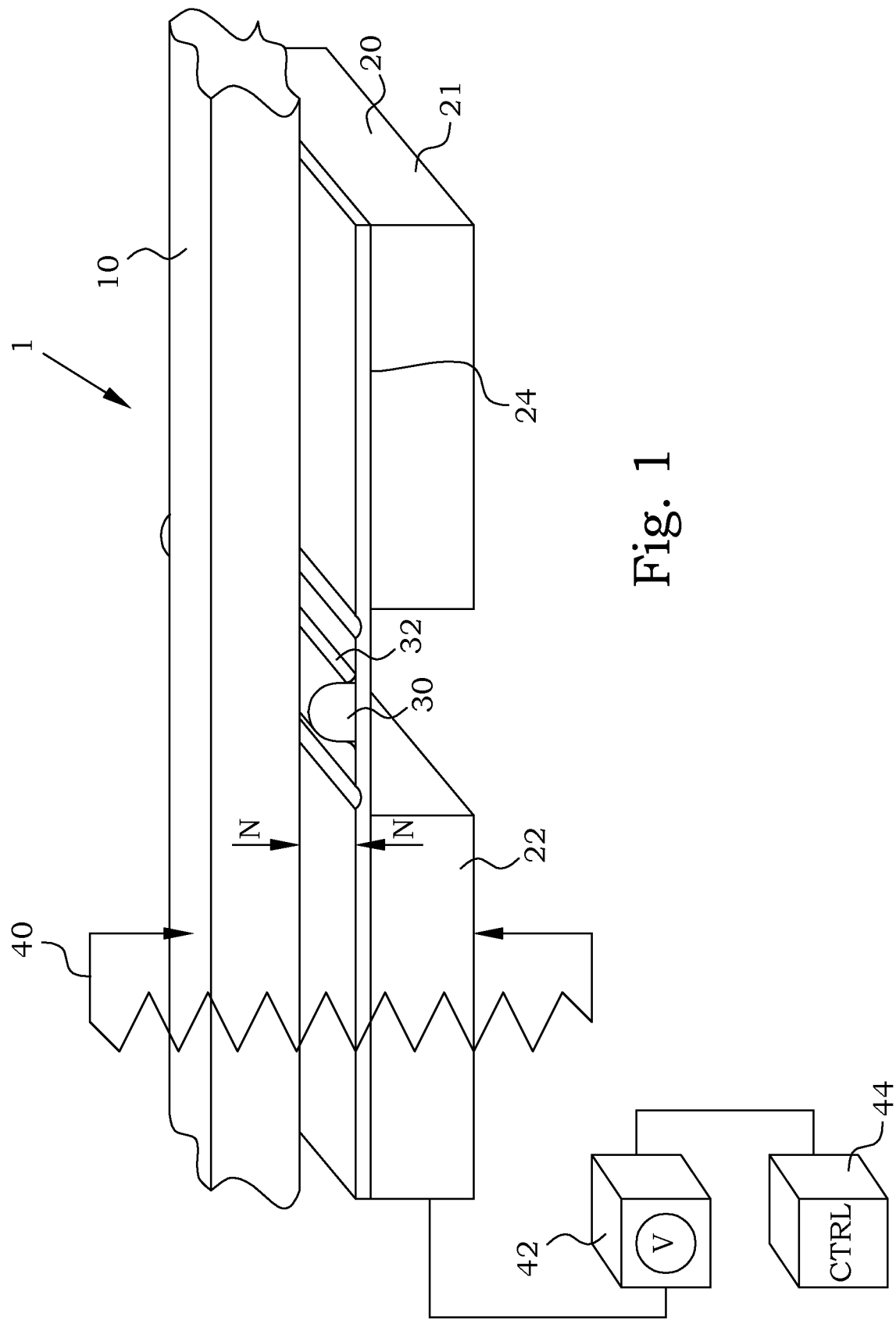
FIG. 1 illustrates an example of an electromechanical motor.

For a better understanding of the proposed technology, it may be useful to begin with a brief overview of a typical electromechanical motor. FIG. 1 illustrates one embodiment of an electromechanical motor 1. The electromechanical motor 1 comprises in this embodiment an electromechanical drive element 20. This part is also often referred to a stator. The electromechanical motor 1 further comprises a body to be driven 10. This part is often referred to as a translator or rotor, depending on the actual geometry of the motor. The body to be driven 10 is mounted to, at least temporarily, be in contact with the electromechanical drive element 20.

FIG. 1 also illustrates, in a schematic manner, means 40 for providing a normal force N between the electromechanical drive element 20 and the body to be driven 10. This is typically some kind of spring arrangement. A power supply 42 connected to the electromechanical drive element 20 for excitation of volumes of electromechanical material 22. A control unit 44 is configured to control an operation of the power supply 42.

In this particular embodiment, the electromechanical drive element 20 comprises an excitation body 21 comprising two volumes of electromechanical material 22. The excitation body 21 has a metal plate 24 integrated as a surface of the excitation body 21. The excitation body 21 arranged to cause shape changes of the electromechanical material 22 and the metal plate 24 when the volumes of electromechanical material are excited by a voltage signal. The electromechanical drive element 20 further comprises a drive pad 30. The drive pad 30 is a mechanical-contact part of the electromechanical drive element 20 intended for providing a driving action thereof. It is therefore the intended mechanical interaction part relative the body to be driven 10. At least the contact part of the drive pad 30 is typically made of ceramic material in order to reach suitable friction and wear properties.

In prior art electromechanical motors 1, the drive pad 30 is typically glued, as indicated by the glue volume 32. As was indicated in the background, gluing has certain disadvantages.

Figure 2:
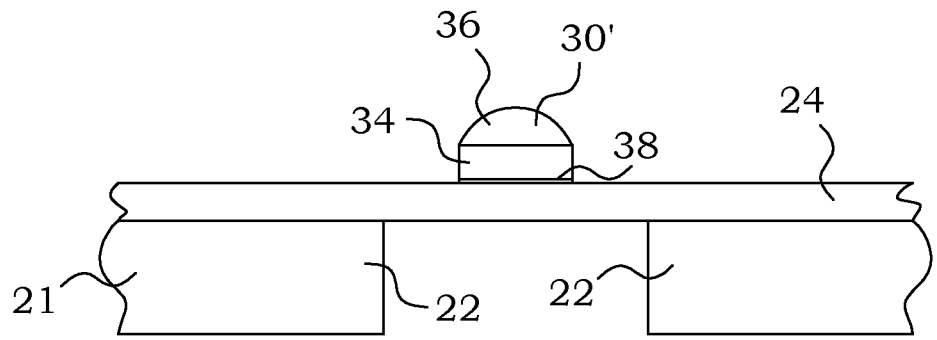
FIG. 2 illustrates schematically a part of an embodiment of an electromechanical drive element.

Instead, according to the preset technology, a metal-based bond. As illustrated in an embodiment of FIG. 2, a metal-based bond 38 is used between the drive pad and the excitation body 21. In order to enable such a fastening, the drive pad is a composite drive pad 30' comprising a metal portion 34 directly joined to a ceramic portion 36. The metal portion 34 of the composite drive pad 30' is attached irreversibly to the metal plate 24 of the excitation body 21 by use of the metal-based bond 38.

Figure 3:
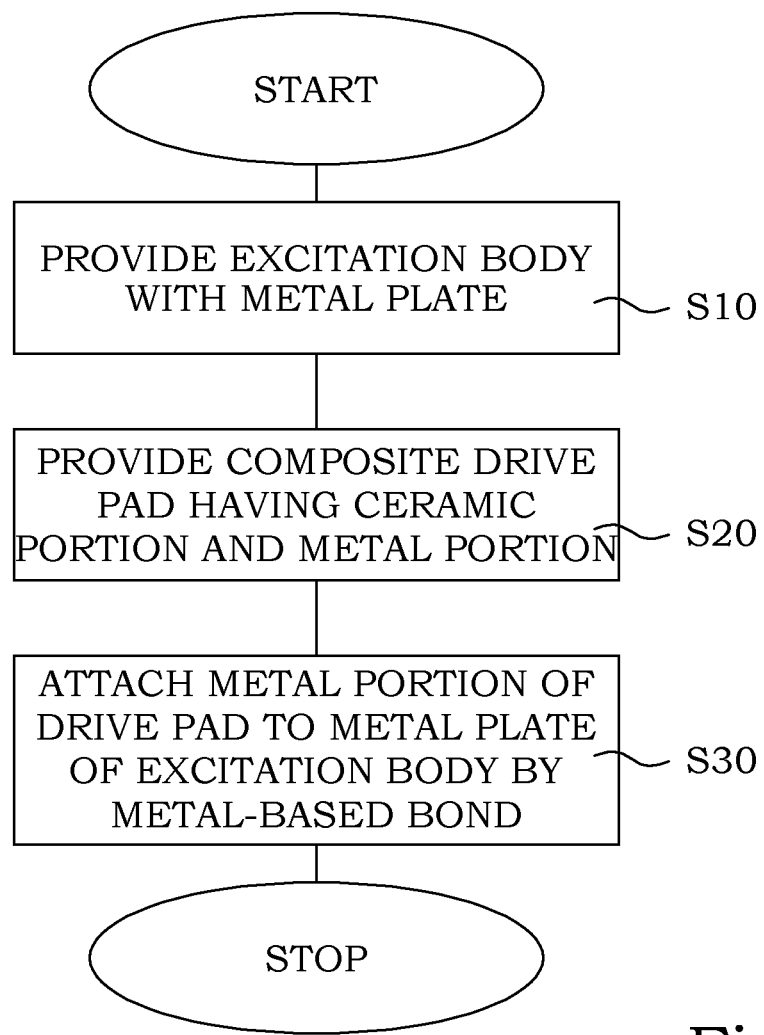
FIG. 3 is a flow diagram of steps of an embodiment of a manufacturing method for an electromechanical drive element.

FIG. 3 illustrates a flow diagram of steps of an embodiment of a manufacturing method for an electromechanical drive element. In step S10, an excitation body is provided. The excitation body comprises at least one volume of electromechanical material. The excitation body has a metal plate integrated as a surface of the excitation body. The excitation body is arranged to cause shape changes of the electromechanical material and the metal plate when the volume or volumes of electromechanical material are excited by a voltage signal.

This step, as such, is well-known in prior art and any person skilled in the art is aware of numerous ways of performing this step. Any further details of the step are not, as such, of importance for the presently discussed ideas, as long as the provided excitation body presents the defined properties.

In step S20, a composite drive pad is provided. The composite drive pad comprises a metal portion directly joined to a ceramic portion. Different embodiments of this step are discussed further below.

In step S30, the metal portion of the composite drive pad is irreversibly attaching to the metal plate of the excitation body. This irreversibly attachment is realized by use of a metal-based bond. The attachment is performed after the step of providing a composite drive pad. In other words, the excitation body and the drive pad are first produced, as such. The attaching process is then performed using the produced parts.

One of the main purposes of the metal portion of the composite drive pad is to create an attachment surface of the ceramics of the drive pad. This metal portion, which in some embodiments can be provided as a bulk metal portion, can be made of many different types of metals. It does not have to present any particular elastic properties, since the drive pad typically is assumed to operate as a stiff bulk piece of material, being the interface to the body to be driven. It is therefore allowed to expose the metal portion of the composite drive pad to higher temperatures than other metals used in the electromechanical drive element. The joining of the metal portion to the ceramic portion can therefore be made at higher temperatures than if the attachment was to be made directly to e.g. a sheet metal of the excitation body.

Figure 4:
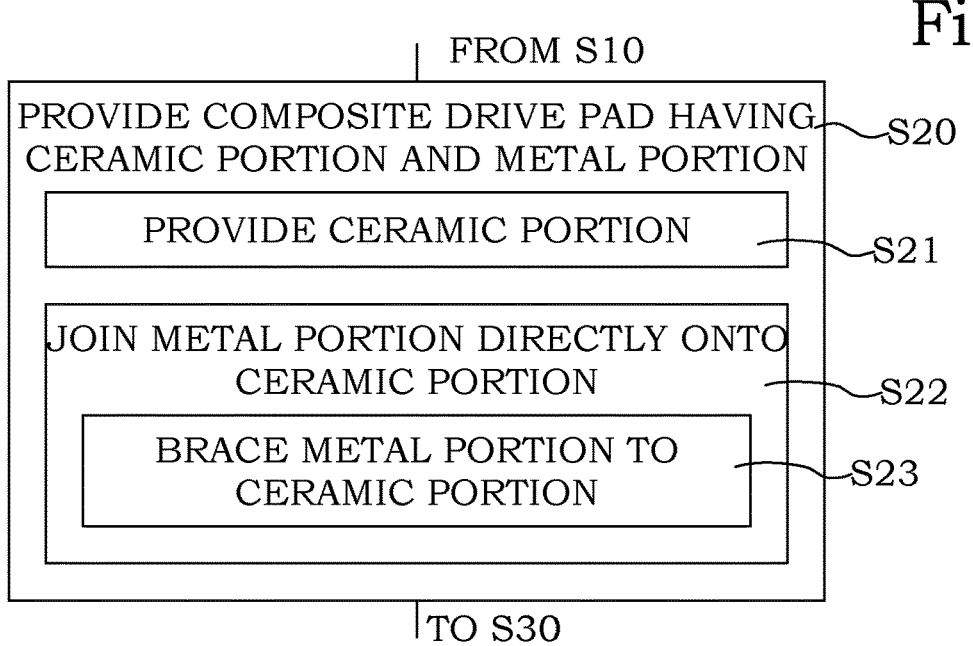
FIG. 4 is a flow diagram of an embodiment of step S20 of FIG. 3.

In one embodiment, illustrated in FIG. 4, the step S20 of providing a composite drive pad comprises the part step S21 of providing the ceramic portion and the part step S22 of joining the metal portion directly onto the ceramic portion. This thereby forms the composite drive pad.

In one further preferred embodiment, the step S22 of joining comprises bracing S23 of the metal portion to the ceramic portion.

Figure 5:
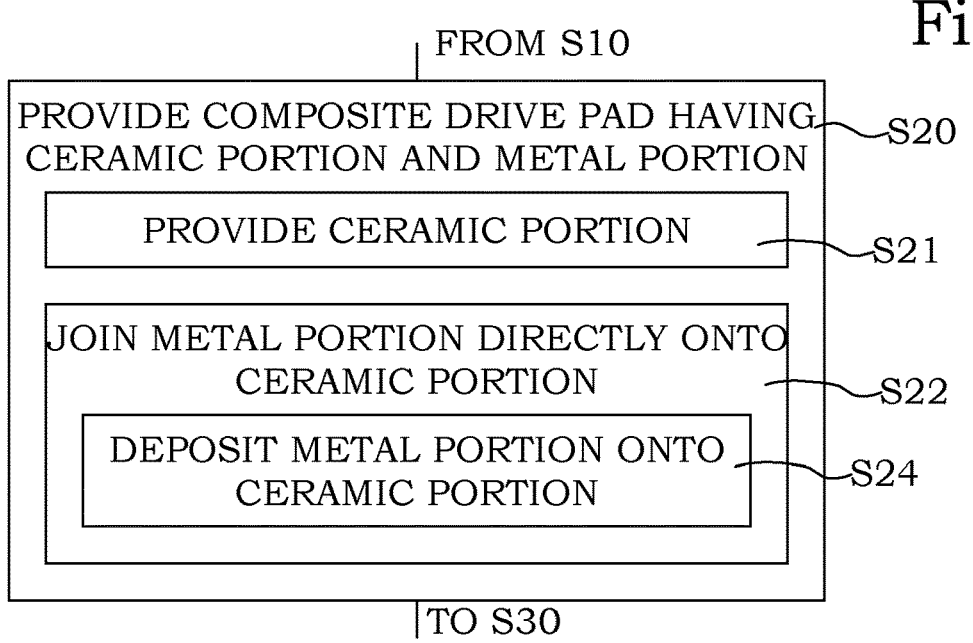
FIG. 5 is a flow diagram of another embodiment of step S20 of FIG. 3.

In an alternative preferred embodiment, as illustrated in FIG. 5, the part step S22 of joining the metal portion directly onto the ceramic portion comprises depositing S24 of the metal portion onto the ceramic portion.

Since the composite drive pad is provided separately from the excitation body, such a depositing can be performed in many different ways. Some non-exclusive examples are screen printing, painting, sputtering, physical vapour deposition and chemical vapour deposition. Such deposition methods are, as such, well known, and a person skilled in the art is aware of how to perform them. Therefore, no further details are necessary to include here.

Figure 6:
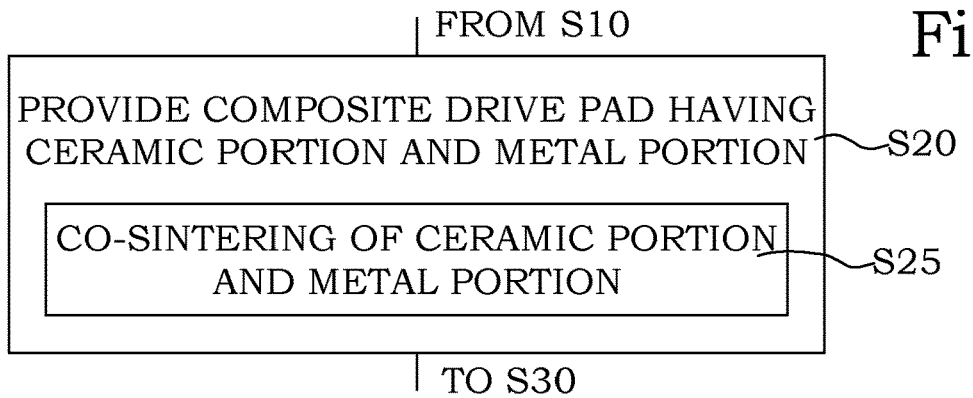
FIG. 6 is a flow diagram of yet another embodiment of step S20 of FIG. 3.

Alternatively, in one embodiment, illustrated in FIG. 6, the step S20 of providing a composite drive pad comprises co-sintering S25 of the ceramic portion and the metal portion. A ceramic green body intended to form the ceramic portion is provided and a metal-comprising material intended to form the metal portion is provided on top of the ceramic green body. The sintering conditions are then selected, as is well-known by any person skilled in the art, to allow a co-sintering of the two portions.

The attachment step S30 can be performed in many different ways, as such known in prior art. In one embodiment, the step of attaching S30 comprises welding of the metal portion of the composite drive pad to the metal plate of the excitation body. In another embodiment, the step of attaching S30 comprises soldering of the metal portion of the composite drive pad to the metal plate of the excitation body. Also other attachment techniques using a metal-based bond are feasible.

When performing an attachment process, it is in some cases advantageous if the metal surfaces that are to be attached are reasonably thick. It is e.g. easier to perform a welding to a metal piece that is 1 mm thick compared to a metal layer of a few micrometers. At the same time, electromechanical motors are typically miniature motors, where size is of importance, and unnecessary material volumes are normally avoided.

The dimension that is of largest importance is the dimension in a direction perpendicular to the surface of the volume of electromechanical material to which the composite drive pad is attached. It has been found that even though it is possible to achieve a metal-based bond to extremely thin metal portions, it is advantageous if the metal portion of the composite drive pad has a thickness of at least 0.01 mm, preferably at least 0.05 mm and most preferably at least 0.2 mm. The practical upper limit of the thickness is typically determined by considerations easily performed by any person skilled in the art based on geometrical relations in each particular application and vary therefore considerably between different applications and embodiments.

As mentioned above, one of the purposes of the metal portion of the composite drive pad is to provide a base for the attachment to the excitation body. However, a metal portion of a composite drive pad can also be utilized for other purposes as well. If such considerations are taken into account, the request for very thin metal portions may also be relaxed.

Figure 7:
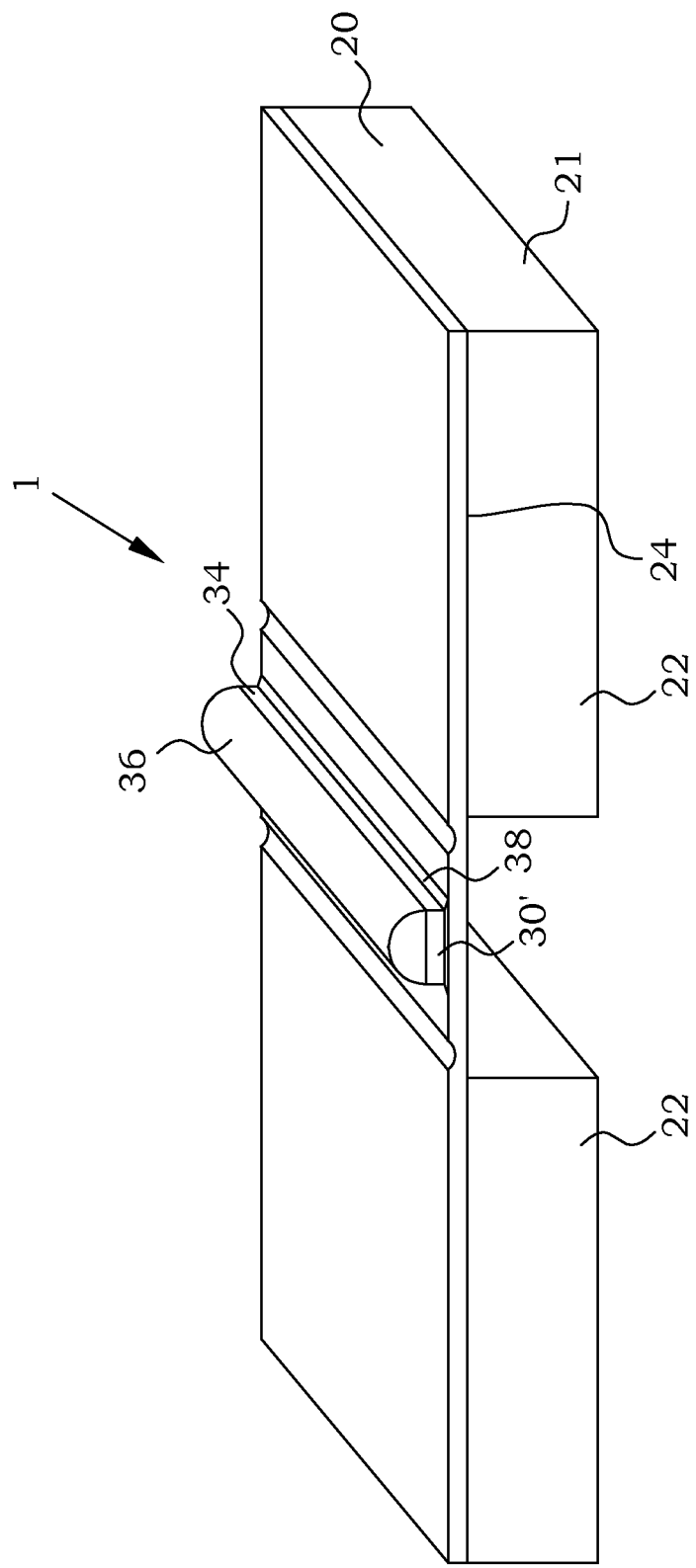
FIG. 7 is a schematic illustration of an embodiment of an electromechanical drive element.

FIG. 7 illustrates one embodiment of an electromechanical drive element 20. The electromechanical drive element 1 comprises an excitation body 21 comprising at least one volume of electromechanical material 22 and a composite drive pad 30'. The composite drive pad 30' is a mechanical-contact part of the electromechanical drive element 20 intended for providing a driving action thereof. The excitation body 21 has a metal plate 24 integrated as a surface of the excitation body 21. The excitation body 21 is arranged to cause shape changes of the electromechanical material 22 and the metal plate 24 when the volume or volumes of electromechanical material are excited by a voltage signal. The composite drive pad has a ceramic portion 36 and a metal portion 34. The metal portion 34 is directly joined onto the ceramic portion 36. The metal portion 34 of the composite drive pad 30' is irreversibly attached to the metal plate 24 of the excitation body 21 by means of a metal-based bond 38.

In one embodiment, the composite drive pad 30' is welded to the metal plate 24 of the excitation body 21. In another embodiment, the composite drive pad 30' is soldered to the metal plate 24 of the excitation body 21.

In one embodiment, the metal portion 34 of the composite drive pad 30' is braced to the ceramic portion 36 of the composite drive pad 30'.

In another embodiment, the metal portion 34 of said composite drive pad 30' is deposited onto the ceramic portion 36 of the composite drive pad 30'. Preferably, this deposition is performed by one of the following methods; screen printing, painting, sputtering, physical vapour deposition, and chemical vapour deposition. Preferably, the deposited metal portion has a thickness of at least 1 µm.

In yet another embodiment, the composite drive pad 30' comprises a co-sintered body comprising the ceramic portion 36 and the metal portion 34.

Traditionally, when using a drive pad of only ceramic material, the geometrical shape and choice of ceramic material were selected as a compromise between the conditions at the joint to the excitation body and the conditions at the contact surface towards a body to be moved. By instead using a composite drive pad, the properties of the ceramic portion can be adapted solely to the conditions in the interaction zone to the body to be moved, e.g. concerning friction and wear properties. Also, particularly if the requested ceramic material is expensive, the volume of the ceramic portion can be kept relatively small, since the contact zone towards the body to be moved typically is very limited. Similarly, the metal portion of the composite drive pad can be adapted for providing the optimum conditions for the joint towards the excitation body without having to consider any friction or wear issues.

Figure 8A:
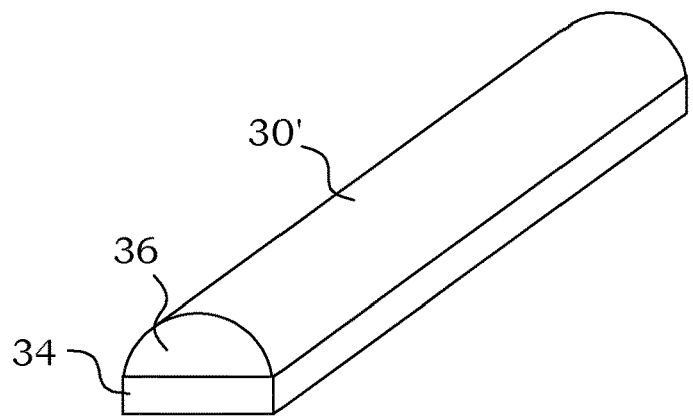
FIGS. 8A-E are schematic illustrations of different embodiments of composite drive pads.

FIG. 8A illustrates one simple embodiment of a composite drive pad 30'. Here, the ceramic portion 36 is shaped as a segment of a cylinder, while the metal portion 34 has the shape of a rectangular cuboid.

Figure 8C:
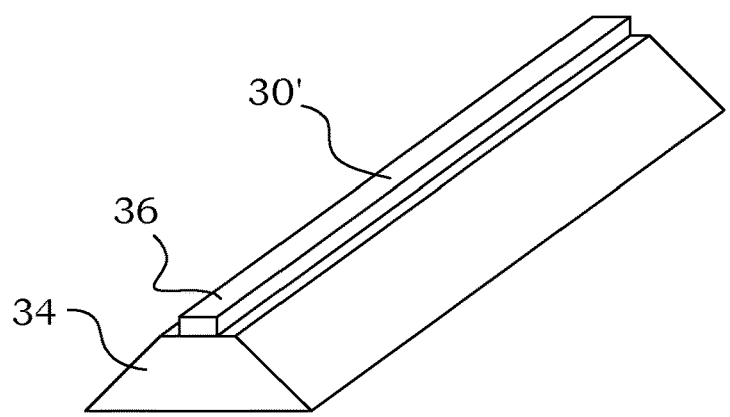
Figure 8E:
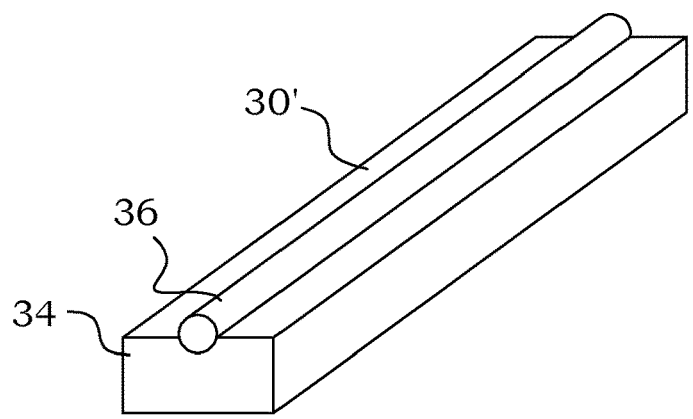
Figure 8B:
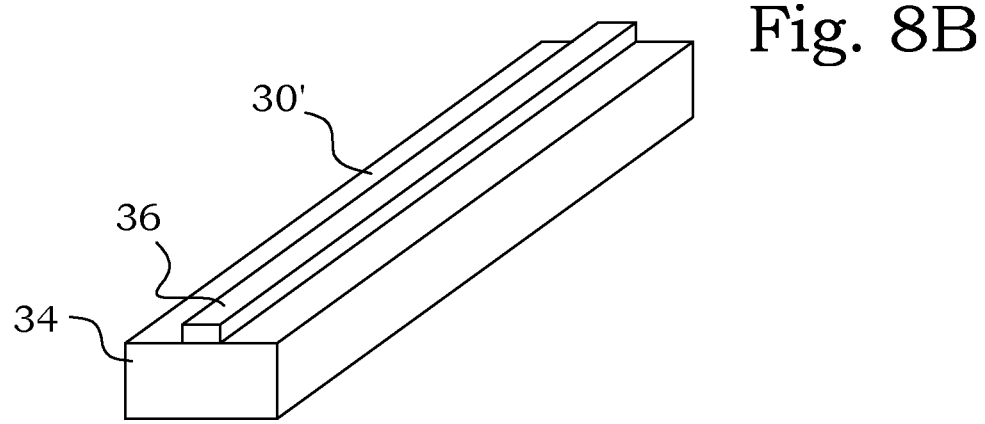

FIG. 8B illustrates another embodiment of a composite drive pad 30'. Here, the size of the ceramic portion 36 is reduced to fit the requested contact area towards the body to be moved. The metal portion 34 has a larger base, which enables a steady joint towards the excitation body.

FIG. 8C illustrates yet another embodiment of a composite drive pad 30'. Here, the metal portion 34 is designed with cut side surfaces 35, enabling a tilting of the composite drive pad 30' relative to a body to be driven, without risking any contact with the metal portion 34. Such a design could also be of interest e.g. if the body to be driven has a concave driving surface.

Figure 8D:
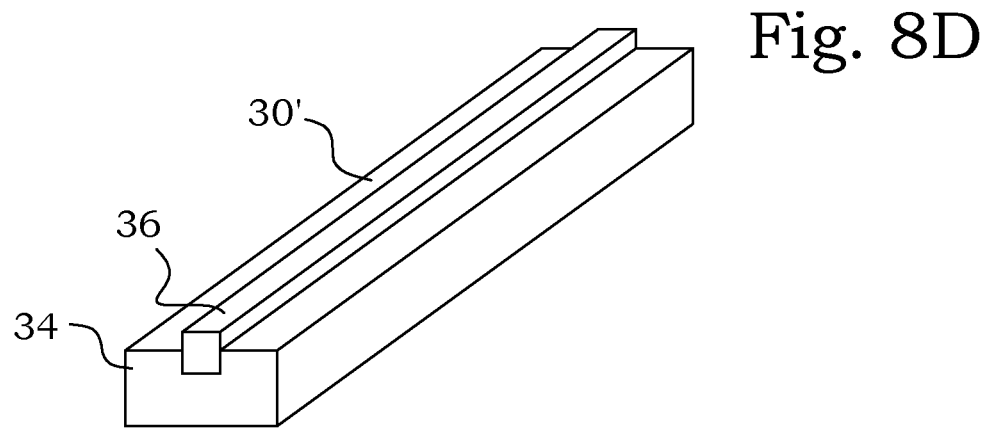

FIG. 8D illustrates yet another embodiment of a composite drive pad 30'. Here, the metal portion 34 is provided with a recess 33. The ceramic portion 36 is mounted at the bottom of the recess 33 and is furthermore supported by the sides of the recess to improve the strength of the composite drive pad 30' in a direction transverse to the recess 33. This might be useful in applications having very high driving forces in a direction transverse to the recess 33.

FIG. 8E illustrates yet another embodiment of a composite drive pad 30'. This embodiment resembles the embodiment of FIG. 8D, but with a cylindrical ceramic portion 36.

It can be noted that in several of the embodiments, the metal portion 36 of the composite drive pad 30' has a larger volume than the ceramic portion 34 of the composite drive pad 30'.

It can also be noted that in several of the embodiments, the metal portion 34 of the composite drive pad 30' has a larger volume than the ceramic portion 36 of the composite drive pad 30'.

It can also be noted that in several of the embodiments, the metal portion 34 of the composite drive pad 30' has a larger width than the ceramic portion 36 of the composite drive pad, in at least one direction parallel to the surface of the volume of electromechanical material to which the composite drive pad 30' is attached.

It is obvious that a person skilled in the art, inspired by the above illustrations, is able to design further embodiments of the composite drive pad 30' according to similar principles as was exemplified above.

Figure 9:
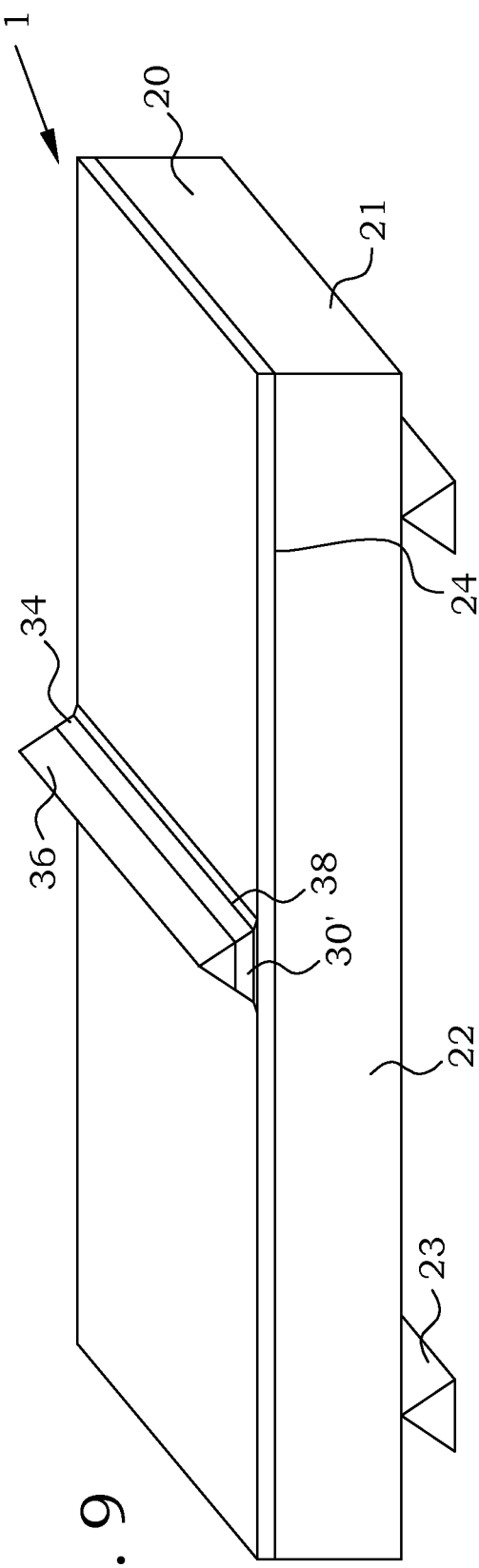
FIG. 9 is a schematic illustration of another embodiment of an electromechanical drive element.

The above presented ideas can be applied to a large variety of electromechanical drive elements. One embodiment is illustrated in FIG. 9. In this embodiment, the excitation body 21 comprises one volume of electromechanical material 22. However, by utilizing electrodes incorporated in the volume of electromechanical material 22, different parts of the volume can be controlled separately to perform shape changes in different parts of the volume. The volume of electromechanical material 22 thereby constitutes a vibrating body. The composite drive pad 30' is provided at the center of the volume of electromechanical material 22, and volume of electromechanical material 22 is supported by mechanical supports 23 at an outer part thereof.

As mentioned above, the electromechanical drive elements typically constitute stator parts of an electromechanical motor. With reference to FIG. 1, but with the conventional drive pad 30 exchanged for a composite drive pad, an embodiment of an electromechanical motor 1 is illustrated. The electromechanical motor 1 comprises an electromechanical drive element 20 according to the ideas presented above. The electromechanical motor 1 further comprises a body 10 to be driven, mounted to be in contact with the ceramic portion of the composite drive pad, means 40 for providing a normal force between the electromechanical drive element 20 and the body to be driven 10, a power supply 42 connected to the excitation body for exciting the volume or volumes of electromechanical material, and a control unit 44 configured to control an operation of the power supply 42.

In the present embodiment, the electromechanically active material is supposed to be a piezoelectric material and electrodes are typically arranged to provide an electrical potential difference between electrodes on either sides of a volume of the piezoelectric material. The electrical field so applied across the material will give rise to geometrical shape changes. Depending on the design, the shape changes may be of different kinds.

Other electromechanically active materials, such as electrostrictive and antiferroelectric materials can also be utilized for this purpose, then with suitable electrical signals applied over the electromechanically active material. These materials could be single crystalline as well as polycrystalline or amorphous. The arrangements for providing the necessary signals, e.g. electrode arrangements, may be provided on the outer side of the material volume to be excited. However, in particular embodiments, to reduce the necessary voltages that are applied, multilayer techniques may be used. The use of multilayer techniques is as such well known in prior art.

Examples of motor solution in which the above presented ideas are advantageously applicable can e.g. be found in the published international patent applications WO2019/035757A1 and WO2019/045630A1.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A manufacturing method for an electromechanical drive element, comprising the steps of:
   providing an excitation body comprising at least one volume of electromechanical material;
   said excitation body having a metal plate integrated as a surface of said excitation body;
   said excitation body being arranged to cause shape changes of said electromechanical material and said metal plate when said at least one volume of the electromechanical material being excited by a voltage signal;
   providing a composite drive pad;
   said composite drive pad comprising a metal portion directly joined to a ceramic portion; and
   attaching, after said step of providing the composite drive pad, said metal portion of said composite drive pad irreversibly to said metal plate of said excitation body by use of a metal-based bond.

2. The manufacturing method according to claim 1, wherein said step of attaching comprises welding of said metal portion of said composite drive pad to said metal plate of said excitation body.

3. The manufacturing method according to claim 1, wherein said step of attaching comprises soldering of said metal portion of said composite drive pad to said metal plate of said excitation body.

4. The manufacturing method according to claim 1, wherein said step of providing the composite drive pad comprises the steps of:
   providing said ceramic portion; and
   joining said metal portion directly onto said ceramic portion, thereby forming said composite drive pad.

5. The manufacturing method according to claim 4, wherein said step of joining comprises bracing of said metal portion to said ceramic portion.

6. The manufacturing method according to claim 4, wherein said step of joining comprises depositing of said metal portion onto said ceramic portion.

7. The manufacturing method according to claim 6, wherein said depositing comprises one of:
   screen printing,
   painting,
   sputtering,
   physical vapour deposition, and
   chemical vapor deposition.

8. The manufacturing method according to claim 1, wherein said step of providing the composite drive pad comprises co-sintering of said ceramic portion and said metal portion.

9. An electromechanical drive element, comprising:
   an excitation body comprising at least one volume of electromechanical material; and
   a composite drive pad, said composite drive pad being a mechanical-contact part of said electromechanical drive element configured to provide a driving action thereof;
   said excitation body having a metal plate integrated as a surface of said excitation body;
   said excitation body being arranged to cause shape changes of said electromechanical material and said metal plate when said at least one volume of the electromechanical material being excited by a voltage signal;

said composite drive pad having a ceramic portion and a metal portion;

wherein said metal portion of said composite drive pad, being directly joined onto said ceramic portion and being irreversibly attached to said metal plate of said excitation body by means of a metal-based bond.

10. The electromechanical drive element according to claim 9, wherein said composite drive pad being welded to said metal plate of said excitation body.

11. The electromechanical drive element according to claim 9, wherein said composite drive pad being soldered to said metal plate of said excitation body.

12. The electromechanical drive element according to claim 9, wherein said metal portion of said composite drive pad is braced to said ceramic portion of said composite drive pad.

13. The electromechanical drive element according to claim 9, wherein said metal portion of said composite drive pad has a thickness of at least 0.01 mm, preferably at least 0.05 mm and most preferably at least 0.2 mm, in a direction perpendicular to a surface of said at least one volume of the electromechanical material to which said composite drive pad is attached.

14. The electromechanical drive element according to claim 12, wherein said metal portion of said composite drive pad has a larger volume than said ceramic portion of said composite drive pad.

15. The electromechanical drive element according to claim 9, wherein said metal portion of said composite drive pad has a larger width than said ceramic portion of said composite drive pad, in at least one direction parallel to a surface of said at least one volume of the electromechanical material to which said composite drive pad is attached.

16. The electromechanical drive element according to claim 9, wherein said metal portion of said composite drive pad is deposited onto said ceramic portion of said composite drive pad.

17. The electromechanical drive element according to claim 16, wherein said metal portion of said composite drive pad is deposited onto said ceramic portion of said composite drive pad by one of:
screen printing,
painting,
sputtering,
physical vapour deposition, and
chemical vapor deposition.

18. The electromechanical drive element according to claim 16, wherein said deposited metal portion has a thickness of at least 1 µm.

19. The electromechanical drive element according to claim 9, wherein said composite drive pad comprises a co-sintered body comprising said ceramic portion and said metal portion.

20. An electromechanical motor, comprising:
said electromechanical drive element according to claim 9;
a body to be driven, mounted to be in contact with said ceramic portion of said composite drive pad;
means for providing a normal force between said electromechanical drive element and said body to be driven;
a power supply connected to said excitation body for exciting said at least one volume of electromechanical material; and
a control unit configured to control an operation of said power supply.

* * * * *